United States Patent
Irrinki et al.

[19]

[11] Patent Number: 5,847,990
[45] Date of Patent: Dec. 8, 1998

[54] RAM CELL CAPABLE OF STORING 3 LOGIC STATES

[75] Inventors: V. Swamy Irrinki, Milpitas; Ashok Kapoor; Raymond T. Leung, both of Palo Alto; Alex Owens, Los Gatos; Thomas R. Wik, Livermore, all of Calif.

[73] Assignee: LSI Logic Corporation, Milpitas, Calif.

[21] Appl. No.: 779,993

[22] Filed: Dec. 23, 1996

[51] Int. Cl.$^6$ .................................................. G11C 11/00
[52] U.S. Cl. ...................... 365/154; 365/230.05; 365/156
[58] Field of Search .................................... 365/154, 205, 365/156, 230.05

[56] References Cited

U.S. PATENT DOCUMENTS

| | | | |
|---|---|---|---|
| 4,057,788 | 11/1977 | Sage | 365/174 |
| 4,633,438 | 12/1986 | Kume et al. | 365/51 |
| 4,661,929 | 4/1987 | Aoki et al. | 365/149 |
| 4,715,014 | 12/1987 | Tuvell et al. | 365/187 |
| 4,910,709 | 3/1990 | Dhong et al. | 365/149 |
| 4,935,896 | 6/1990 | Matsumura et al. | 365/149 |
| 4,984,204 | 1/1991 | Sato et al. | 365/230.05 |
| 5,021,999 | 6/1991 | Kohda et al. | 365/168 |
| 5,119,330 | 6/1992 | Tanagawa | 365/168 |
| 5,159,570 | 10/1992 | Mitchell et al. | 365/182 |
| 5,172,338 | 12/1992 | Mehrotra et al. | 365/201 |
| 5,282,162 | 1/1994 | Ochii | 365/189.01 |
| 5,283,761 | 2/1994 | Gillingham | 365/189.07 |
| 5,289,432 | 2/1994 | Dhong et al. | 365/230.05 |
| 5,351,210 | 9/1994 | Saito | 365/189.01 |
| 5,357,464 | 10/1994 | Shukuri et al. | 365/189.01 |
| 5,394,362 | 2/1995 | Banks | 365/168 |
| 5,459,686 | 10/1995 | Saito | 365/149 |
| 5,521,865 | 5/1996 | Ohuchi et al. | 365/185.22 |
| 5,532,955 | 7/1996 | Gillingham | 365/149 |
| 5,541,874 | 7/1996 | O'Connor | 365/156 |

OTHER PUBLICATIONS

Abbott, et al., "A 4K MOS Dynamic Random–Access Memory," IEEE Journal of Solid–State Circuits, vol. SC–8, No. 5, Oct. 1973, pp. 292–298.

*Primary Examiner*—David C. Nelms
*Assistant Examiner*—Michael T. Tran
*Attorney, Agent, or Firm*—Conely, Rose & Tayon; B. Noel Kivlin

[57] ABSTRACT

A memory circuit which enables storage of three logic states in a memory cell. Since the additional logic states may be used to represent additional information bits, this memory circuit increases the number of bits that may be stored per memory cell, thereby increasing the storage density and reducing the cost per bit. The disclosed memory circuit comprises an analog-to-digital converter coupled to detect a current through a transistor in a memory cell. The current is determined by the state of a tri-state flip-flop. By enabling the current to be detected as positive, negative, or zero, it becomes possible to represent more than one bit of information with the state of the flip-flop.

5 Claims, 4 Drawing Sheets

RAM CELL CAPABLE OF STORING 3 LOGIC STATES

BACKGROUND OF THE INVENTION

1. Field of the Invention

This invention relates to the field of solid state devices for information storage, and in particular to a method and structure for storing discrete logic states in a random access memory.

2. Description of the Related Art

Memory devices store and retrieve large quantities of digital data at electronic speeds. Early digital computers used magnetic cores as the devices in fast-access memories. With the introduction of semiconductor memory chips in the late 1960s, magnetic cores began to be replaced by integrated circuits which implement a much higher-density memory function. This not only increased the performance capabilities of the memory, but also drastically decreased its cost. By the end of the 1970s, magnetic core memories had been completely displaced as high-speed memory devices.

Memory capacities in digital systems are commonly expressed in terms of bits (binary digits), since a separate device or circuit is used to store each bit of data. Each storage element is referred to as a cell. Memory capacities are also sometimes stated in terms of bytes (8 or 9 bits) or words (arbitrarily defined, but commonly 16–80 bits). Every bit, byte, or word is stored in a particular location, identified by a unique numeric address. Only a single bit, byte, or word is stored or retrieved during each cycle of memory operation.

The units of memory storage capacity are typically kilobits and megabits (or kilobytes and megabytes). Since memory addressing is based on binary codes, capacities that are integral powers of 2 are typically used. As a result, a memory device with a 1-kbit capacity can actually store 1024 bits, and a 64-kbyte device can store 65,536 bytes.

In digital computers, the number of memory bits is usually 100 to 1000 times greater than the number of logic gates, which implies that the memory cost per bit must be kept very low. In addition, it is desirable for the memory devices to be as small as possible (since this will allow the highest density of cells on a chip), to operate at a high speed, to have a small power consumption, and to operate reliably. To achieve this end, memory cells are designed to be as simple and compact as possible. Typically, the cell itself is not capable of outputting digital data in an electrical form compatible with the requirements of the remainder of the system. To restore the electrical characteristics of the cell's outputted data to adequate values, properly designed peripheral circuits (e.g. sense amplifiers, memory registers, and output drivers) are necessary. These circuits are designed to be shared by many memory cells. The trade-off thus made is that of a less robust output signal from the cell, in exchange for a simple, compact memory cell design.

The most flexible digital memories are those that allow for data storage (hereafter, writing) as well as data retrieval (hereafter, reading). Memories in which both of these functions can be rapidly and easily performed, and whose cells can be accessed in random order (independent of their physical locations), are referred to as random-access memories (RAMs). Read-only memories (ROMs) are those in which only the read operation can be performed rapidly. Entering data into a ROM is referred to as programming the ROM. This operation is much slower than the writing operation used in RAMs.

The storage cells in a typical semiconductor memory are arranged in an array consisting of horizontal rows and vertical columns. Each cell shares electrical connections with all the other cells in its row, and column. The horizontal lines connected to all the cells in the row are called word lines, and the vertical lines (along which data flows into and out of the cells) are referred to as data lines. Each cell therefore has a unique memory location, or address, which can be accessed at random through the selection of the appropriate word and data line. Some memories are designed so that all the cells in a row are accessed simultaneously. This array configuration of semiconductor memories lends itself well to the regular structured designs which are favored in VLSI.

There are a number of important circuits on the periphery of the array. One such peripheral circuit is the address decoder. This circuit allows a large number of word and data lines to be accessed with the fewest number of address lines. Address decoders for this purpose have $2^n$ output lines, with a different one selected for each different n-bit input code. In later generations of memory circuits, address multiplexing was integrated on some memory chips to reduce the number of address pins by half.

Another peripheral circuit is the read/write control circuitry. This circuitry determines whether data is to be written into or read from the memory. Because such circuits also amplify and buffer the data signals retrieved from the cells, one of the important circuits in this subsystem is the sense amplifier. In dynamic memories that need periodic data refreshing, refresh circuitry may also be provided.

Recently, additional peripheral circuits have been added to the basic memory organization structure. These circuits serve mainly to improve the manufacturability and testability of the chips. Those designed to increase manufacturability include redundancy circuits and error-correction circuits. Redundancy circuits allow some defective chips to be salvaged, while self-testing circuits reduce testing time. Error-detection and correction techniques involve the addition of parity bits to allow the system to detect bad data, accomplish parity checking, and in some cases provide correction of the data errors.

Most RAMs have only one input-data lead and one output-data lead (or a single combined input/output lead). Writing into and reading from such RAMs is done one bit at a time. Other RAMs have a number of input- and output-data leads, with the number determined by the word length of the system's data bus. ROMs, on the other hand, are typically organized so that the number of output-data leads is the same as the number of lines on the data bus. ROMs are programmed word by word and are read from in the same manner.

In semiconductor RAMs, information is stored on each cell either through the charging of a capacitor or the setting of the state of a bi-stable flip-flop circuit. With either method, the information on the cell is destroyed if the power is interrupted. Such memories are therefore referred to as volatile memories. When the charge on a capacitor is used to store data in a semiconductor-RAM cell, the charge needs to be periodically refreshed, since leakage currents will remove it in a few milliseconds. Hence, volatile memories based on this storage mechanism are known as dynamic RAMs, or DRAMs.

If the data is stored (written) by setting the state of a flip-flop, it will be retained as long as power is connected to the cell (and flip-flop is not reset by another write signal). RAMs fabricated with such cells are known as static RAMs, or SRAMs. Volatile RAMs can be treated as non-volatile if they are provided with a battery backup. Some DRAM and SRAM chips are even packaged together with a battery to facilitate implementation of this approach.

It is often desirable to use memory devices that will retain information even when the power is interrupted. Magnetic media offer such nonvolatile-memory storage. In addition, a variety of semiconductor memories have been developed with this characteristic. At present, virtually all such non-volatile memories are ROMs. While data can be entered into these memories, the programming procedure varies from one type of ROM to the other.

The first group of nonvolatile memories consists of those ROMs in which data is entered during manufacturing, and cannot be subsequently altered by the user. These devices are known as masked ROMs (or simply ROMs). The next category consists of memories whose data can be entered by the user (user-programmable ROMs). In the first example of this type, known as a programmable ROM, or PROM, data can be entered into the device only once. In the remaining ROM types, data can be erased as well as entered. In one class of erasable ROMs, the cells must be exposed to a strong ultraviolet light in order for the data to be erased. These ROMs are called erasable-programmable ROMs, or EPROMs. In the final type, data can be electrically erased as well as entered into the device; these are referred to as EEPROMs. The time needed to enter data into both EPROMs and EEPROMs is much longer than the time required for the write operation in a RAM. As a result, none of the ROM types can at present be classified as fully functional RAM devices.

Many variations on the basic memory organization architecture have been developed, including video RAMs and multiport RAMs. Architectures which combine memory and logic circuits on the same chip are becoming increasingly popular. But the primary trends in semiconductor memory development are to increase the storage density and to reduce the cost per bit. It would therefore be desirable to have a method and structure for further increasing the bit storage density and reducing the cost per bit.

SUMMARY OF THE INVENTION

The problems outlined above are in large part solved by a memory circuit which enables storage and retrieval of three logic states in a memory cell. In one embodiment, the memory cell has a tri-state flip-flop configuration. When enabled, a read transistor creates a conductive path to a positive voltage, a zero voltage, or a high impedance. If a read line is maintained at an intermediate voltage, enabling the read transistor causes a positive current, a negative current, or a zero current. A sense amplifier configured to detect these three currents allows retrieval of the stored logic state. Since the additional logic states may be used to represent additional information bits, this memory circuit increases the number of bits that may be stored per memory cell, thereby increasing the storage density and reducing the cost per bit.

Broadly speaking, the present invention contemplates a memory cell. The memory cell includes an impedance transistor, a flip-flop, a read transistor, a first write transistor, and a second write transistor. The impedance transistor has a first terminal, a second terminal, and a gate. The gate is configured to store a charge indicative of a data magnitude. The flip-flop has an input node, an output node, and a power node. The output node is coupled to the first terminal of the impedance transistor. The flip-flop is configured to hold a state indicative of a data sign. The read transistor is coupled to the second terminal of the impedance transistor. The read transistor is configured to conduct a current through the impedance transistor when a read signal is asserted. The first write transistor is coupled to the input node, and configured to set the state of the flip-flop when a write signal is asserted. The second write transistor is coupled to the gate of the impedance transistor, and configured to store a charge on the gate when the write signal is asserted.

BRIEF DESCRIPTION OF THE DRAWINGS

Other objects and advantages of the invention will become apparent upon reading the following detailed description and upon reference to the accompanying drawings in which.

Figure 1:
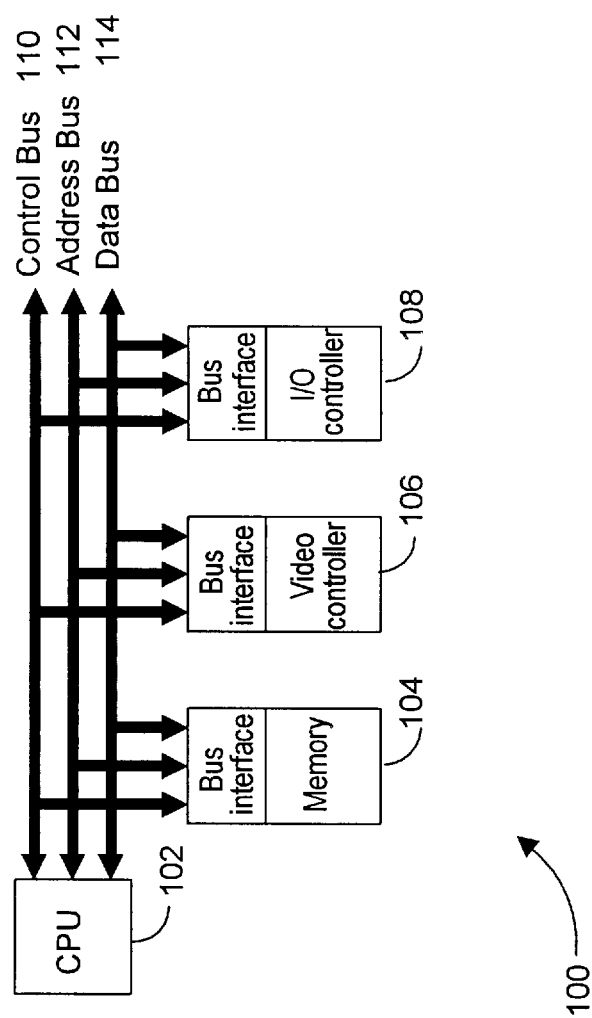
FIG. 1 is a signal flow diagram illustrating a computer system having memory and a CPU which communicate via a control bus, an address bus, and a data bus.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning now to FIG. 1, a computer system 100 is shown having a CPU 102 coupled to three peripherals: a memory 104, a video controller 106, and an I/O controller 108. One or more bus bridge units (not shown) may be interposed between CPU 102 and the peripherals. Memory 104, video controller 106, and I/O controller 108 each include a bus interface. As will be described further below, memory 104 includes memory cells capable of storing three logic states and read/write circuitry for storage and retrieval of these three logic states.

The architecture of computer system 100 allows CPU 102 to read from and write to peripherals via data bus 114. Address bus 112 is used to indicate which device and data address CPU 102 wishes to access, and control bus 110 provides additional signaling lines which are used to indicate the type of access desired and to provide timing information.

Figure 2:
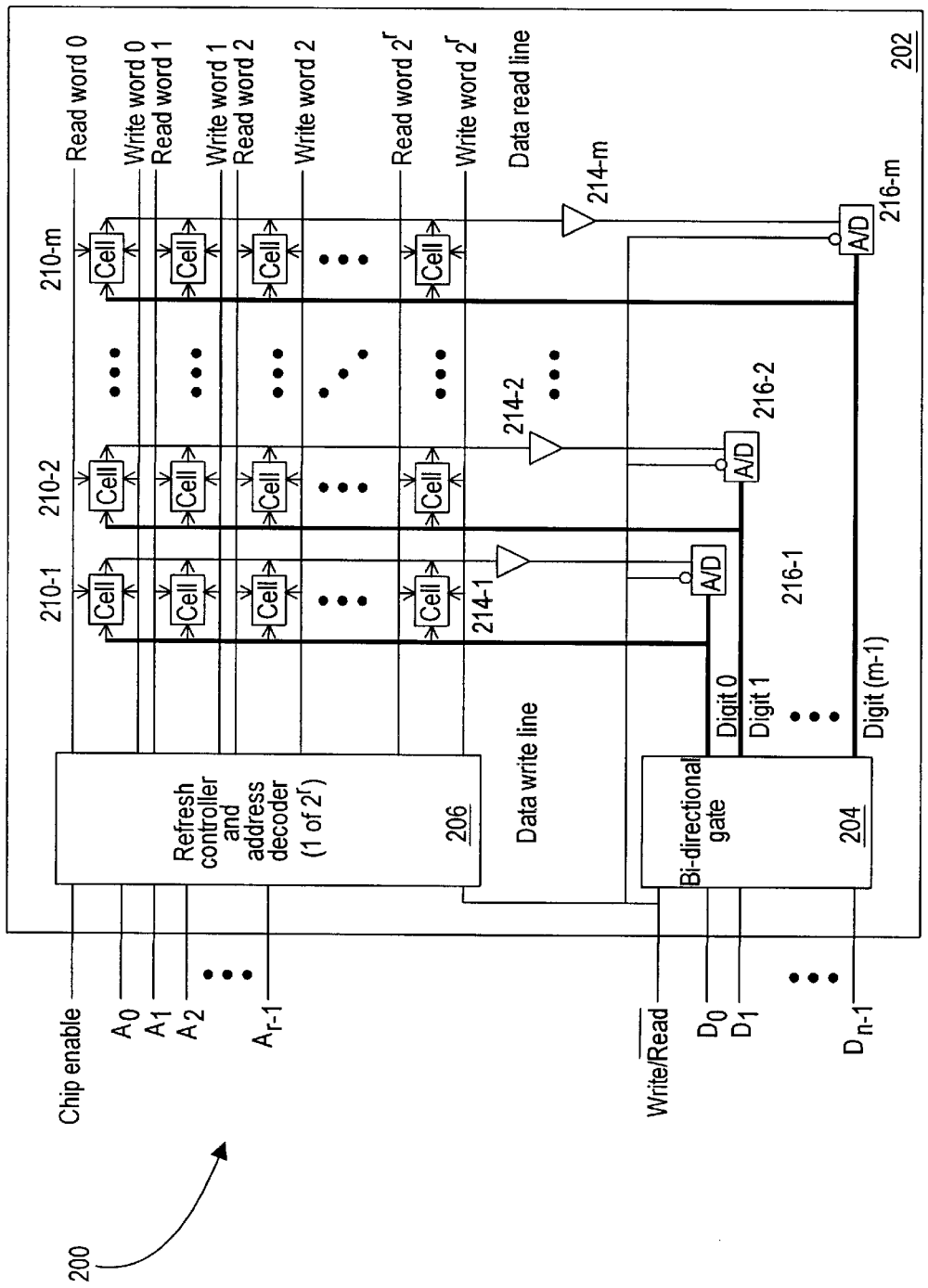
FIG. 2 is a block diagram of a first semiconductor memory architecture capable of storing multiple level logic states according to the present invention.

FIG. 2 shows an exemplary memory architecture employed within computer system 100. In this embodiment, memory 200 has a ground plane 202 surrounding the chip circuitry which shields the circuitry from electromagnetic noise. Memory 200 receives a chip enable signal, a read/write signal, and r address bit signals at an address decoder and refresh unit 206. During operation when the chip enable signal is asserted with the read/write signal indicating a read, address decoder and refresh unit 206 asserts one of $2^r$ read word lines. Each of the read word lines is coupled to a row of memory cells. Each row of memory cells is also coupled by a write word line to address controller 206. When a read word line is asserted, the corresponding row of memory cells may be read. Similarly, when a write word line is asserted, the corresponding row of memory cells may be written.

Memory 200 also has n bi-directional binary data lines ($D_0$–$D_{n-1}$) connected to a bi-directional gate 204. Bi-directional gate 204 is coupled to receive the read/write signal and is further coupled to m data paths which carry ternary-value logic signals ($S_0$–$S_{m-1}$). Each of the data paths can be driven by either bidirectional gate 204 or one of a set of analog-to-digital (A/D) converters 216-1 through 216-m (referred to collectively as A/D converters 216). Each of the data paths provides input to one of a set of data line drivers 212-1 through 212-m (referred to collectively as data line drivers 212). Data line drivers 212 each serve to convert the ternary-value logic signal into a three-level voltage signal which is coupled by a data write line to a corresponding column of memory cells. Each column of memory cells is also coupled by a data read line to one of a set of sense amplifiers 214-1 through 214-m, which in turn provides input to one of the A/ID converters 216.

An exemplary memory read operation is now described. Consider a situation in which the address bits are all zero, the write/read control line indicates a read operation, and the chip enable signal is asserted. Upon occurrence of this situation, address decoder and refresh unit 206 asserts the read word line for word 0 (i.e. "Read word 0"). This causes cells 210-1 through 210-m to pass a three-level data signal indicative of information stored in the corresponding cells to the read data lines which are coupled to sense amplifiers 214. Sense amplifiers 214 detect and amplify the three-level data signals and pass the amplified signals to A/D converters 216. A/D converters 216 convert the amplified signals to m ternary-value logic signals ($S_0$–$S_{m-1}$) which are coupled to bi-directional gate 204. Bi-directional gate 204 converts the m ternary-value logic signals ($S_0$–$S_{m-1}$) to n binary digital signals, and drives the n bits on data lines $D_0$–$D_{n-1}$. In this manner, a ternary-value logic state stored in each cell may be read.

In one specific implementation, the cells being read are refreshed concurrent with the read operation. For the implementation of FIG. 2, data drivers 212 convert the m ternary-value logic signals ($S_0$–$S_{m-1}$) into m three-level voltage signals and drive them on the data write lines which are coupled to cells 210. If at this time, the word write line for word 0 is asserted, cells 210 act to store the m three-level voltage signals. In this way, the content of cells 210 can be refreshed every time they are read.

The effectuation of memory write operations is similar. For example, if the address bits are all zero and the write/read control line indicates a write operation when the chip enable signal is asserted, then address decoder and refresh unit 266 asserts the write word line for word 0. Bi-directional gate 204 receives data from the bi-directional binary data lines $D_0$–$D_{n-1}$ and converts the data into m ternary-value logic signals which are driven onto the m data paths. The A/D converters 216 for driving each of the m data paths are disabled while the write/read control line indicates a write operation. Data line drivers 212 convert the input m ternary-value logic signals into m three-level voltage signals and drives the data write lines coupled to the selected cells 210. Having the word write line asserted causes the three-level signal to be stored in cells 210.

Address decoder and refresh unit 206 further includes refresh circuitry to read and refresh the contents of each memory cell within a given time interval. The refresh cycles can be implemented in many ways, one of which is to have them happening continuously while the chip is not enabled. In this implementation method, bidirectional gate 204 is disabled and the A/D converters 216 are enabled during refresh cycles. Address decoder and refresh unit 206 may employ a counter which sequentially asserts each word line, causing a read operation similar to that described previously. In order to assure that each memory cell is refreshed, the chip must spend a specified fraction of a given time interval in the disabled mode.

Figure 3:
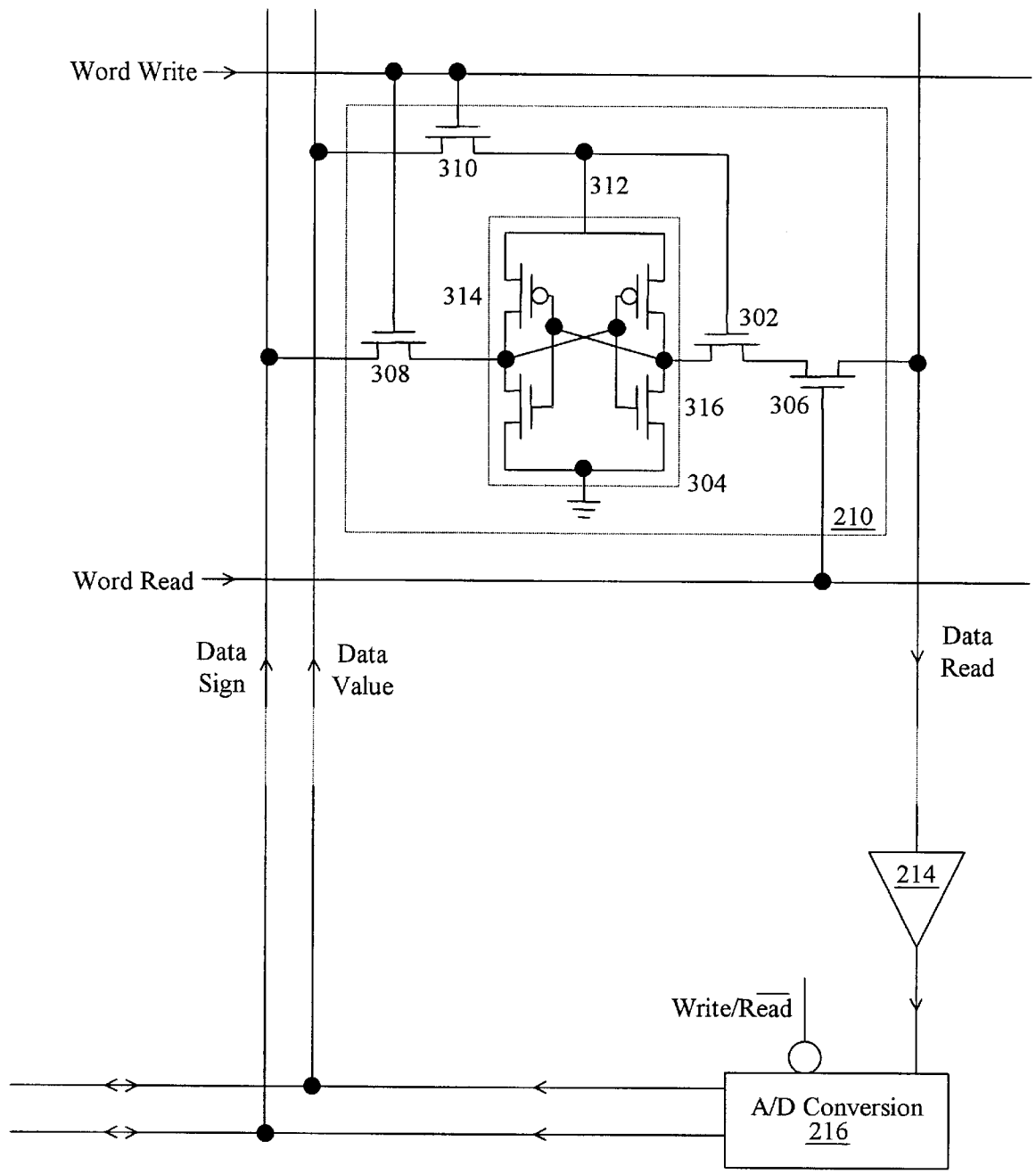
FIG. 3 is a block diagram illustrating details of one embodiment of a memory cell.

Turning now to FIG. 3, portions of memory circuit 200 are shown in greater detail. Circuit portions that correspond to those of FIG. 2 are numbered identically for simplicity and clarity. FIG. 3 illustrates a memory cell 210 which is exemplary of each of the cells of FIG. 2. Memory cell 210 includes an impedance transistor 302, a flip-flop 304, a read transistor 306, a first write transistor 308, and a second write transistor 310. Impedance transistor 302 is a field effect transistor. Flip-flop 304 comprises two cross-connected, complementary MOSFET pairs, each pair consisting of a p-type MOSFET with one terminal connected to a power node 312 and a n-type MOSFET with one terminal connected to ground. The gates of both transistors in each pair are joined, and the second terminals of both transistors are joined to form a common terminal. The MOSFET pairs are cross-connected so that the gates of each pair are joined to the common terminal of the other pair. The resulting flip-flop has the property that when one common terminal (i.e. input node 314) is driven high, the other common terminal (i.e. output node 316) goes low. Both common terminals remain in this state, even in the absence of a driving voltage (i.e. when first write transistor 308 is off). The state where input node 314 is low and output node 316 is high is also stable. The two stable states of input node 314 are used here to represent the sign of the value stored in memory cell 210. When a word write signal is applied to the gate of first write transistor 308, the data sign line drives input node to a high or low voltage to represent a plus or minus sign, respectively.

Output node 316 is connected to one terminal of impedance transistor 302, and the second terminal of impedance transistor 302 is connected to read transistor 306. Second write transistor 310 is connected to the gate of impedance transistor 302. When a word write signal is applied to the gate of second write transistor 310, a charge is stored on the gate of impedance transistor 302. The stored charge is determined by the voltage on the data value line. If the voltage is high, a positive charge is stored, and impedance transistor 302 exhibits a low impedance. If the voltage is low, essentially no charge is stored, and impedance transistor 302 exhibits a high impedance.

When a word read signal is applied to the gate of read transistor 306, a conductive connection is made between impedance transistor 302 and the data read line (which is pre-charged to an intermediate voltage). Under this circumstance, three states may exist. ZERO: the charge stored on the gate of impedance transistor 302 is low, producing a high impedance which allows little or no current to flow. POSITIVE: output node 316 is high, and the charge stored on the gate of impedance transistor 302 is high, producing a low impedance which allows a current to flow from output node 316 to the data read line. NEGATIVE: output node 316 is low, and the charge stored on the gate of impedance transistor 302 is high, producing a low impedance which allows a current to flow to output node 316 from the data read line. These three current states maintain, raise, or lower the voltage of the data read line, and this effect is detected by sense amplifier 214 and converted to a voltage at the input of A/D converter 216. Negative, zero, and positive states would preferentially be represented by 0, V/2, and V, where V is the supply voltage.

In the embodiment shown, power node 312 is connected to the gate of impedance transistor 302. Since no current flows through flip-flop 304 once the state is set, the stored charge on the gate of impedance transistor 302 is sufficient to preserve the state of flip-flop 304 as well as the state of impedance transistor 302. This embodiment is advantageous in the respect that this implementation does not require that a power supply line be routed to each of the memory cells.

Figure 4:
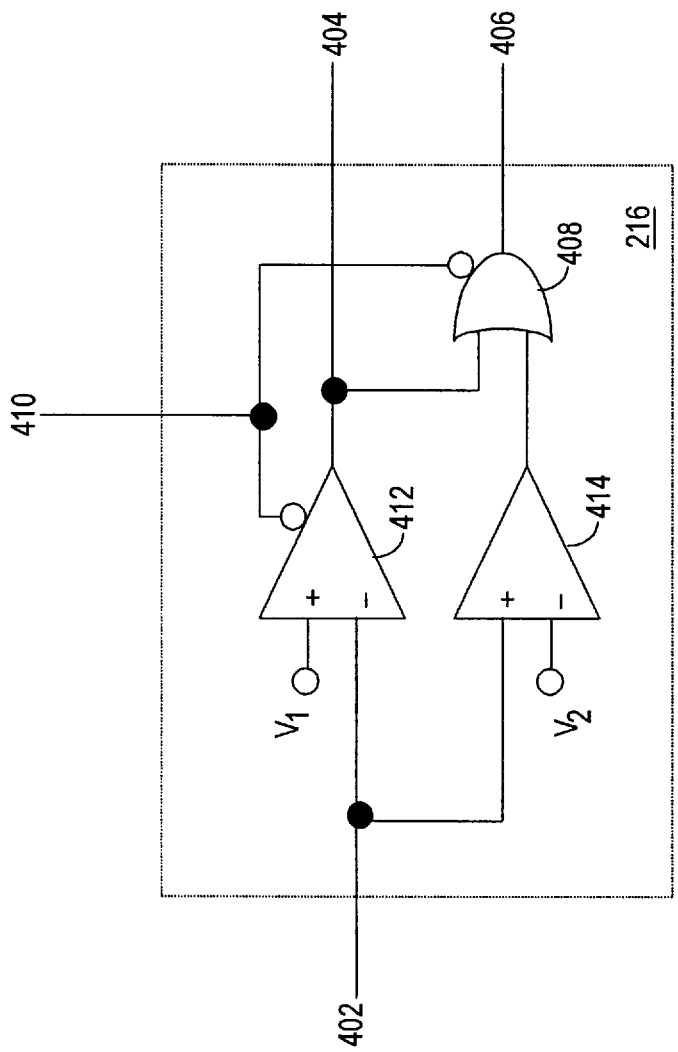
FIG. 4 is a block diagram of an analog to digital converter capable of sensing more than three signal levels and converting them to digital form.

FIG. 4 shows a block diagram of one embodiment of A/D converter 216. A/D converter 216 receives an input signal 402 and drives a digital output signal on data sign line 404 and data value line 406 when enabled by write/read signal 410. During operation, asserting write/read signal 410 drives the output lines to a high impedance state. A/D converter 216 is comprised of two comparators 412 and 414. Comparator 412 asserts data sign line 404 when the value of input signal 402 is less than $V_1$. Due to the presence of OR gate 408, data value line 406 is also asserted under this circumstance. Hence the output of A/D converter 216 when input signal 402 is less than $V_1$ is a binary −1 (11). When input signal 402 is between $V_1$ and $V_2$, the output of both comparators is low, so a binary 0 (00) results. Finally, when input signal 402 is greater than $V_2$, comparator 414 asserts the data value line. For this case, a binary +1 (01) results. $V_1$ is preferentially equal to V/3, and $V_2$ is preferentially equal to 2V/3.

Numerous variations and modifications will become apparent to those skilled in the art once the above disclosure is fully appreciated. It is intended that the following claims be interpreted to embrace all such variations and modifications.

What is claimed is:

1. A memory cell which comprises:
   an impedance transistor having a first terminal, a second terminal, and a gate, said gate is configured to store a charge indicative of a data magnitude;
   a flip-flop having an input node, and an output node, wherein said output node is coupled to said first terminal of said impedance transistor, said flip-flop is configured to hold a state indicative of a data sign;
   a read transistor coupled to said second terminal of said impedance transistor, said read transistor configured to conduct a current through said impedance transistor when a read signal is asserted;
   a first write transistor coupled to said input node, said first write transistor configured to set the state of said flip-flop when a write signal is asserted; and
   a second write transistor coupled to said gate of said impedance transistor, said second write transistor configured to store said charge on said gate when said write signal is asserted.

2. The memory cell of claim 1, wherein said flip-flop has a power node coupled to the gate of said impedance transistor.

3. The memory cell of claim 1, wherein said flip-flop comprises:
   a power node;
   a first p-type MOSFET with a first terminal connected to said power node, a second terminal connected to said input node, and a gate connected to said output node;
   a first n-type MOSFET with a first terminal connected to said input node, a second terminal connected to ground, and a gate connected to said output node;
   a second p-type MOSFET with a first terminal connected to said power node, a second terminal connected to said output node, and a gate connected to said input node; and
   a second n-type MOSFET with a first terminal connected to said output node, a second terminal connected to ground, and a gate connected to said input node.

4. The memory cell of claim 1, wherein said charge being greater than a predetermined value is indicative of a data magnitude of one, and wherein said charge being less than said predetermined value is indicative of a data magnitude of zero.

5. The memory cell of claim 1 wherein said output node having a voltage greater than a predetermined voltage is indicative of a positive data sign, and wherein the voltage of said output node being less than said predetermined voltage is indicative of a negative data sign.

* * * * *